(12) United States Patent
Sumiyoshi

(10) Patent No.: US 10,566,184 B2
(45) Date of Patent: Feb. 18, 2020

(54) PROCESS OF DEPOSITING SILICON NITRIDE (SiN) FILM ON NITRIDE SEMICONDUCTOR

(71) Applicant: SUMITOMO ELECTRIC INDUSTRIES, LTD., Chuo-ku, Osaka-shi (JP)

(72) Inventor: Kazuhide Sumiyoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 78 days.

(21) Appl. No.: 15/941,543

(22) Filed: Mar. 30, 2018

(65) Prior Publication Data
US 2018/0286661 A1 Oct. 4, 2018

(30) Foreign Application Priority Data
Apr. 3, 2017 (JP) ................. 2017-073821

(51) Int. Cl.
| | | |
|---|---|---|
| H01L 21/02 | (2006.01) | |
| H01L 21/311 | (2006.01) | |
| H01L 21/027 | (2006.01) | |
| H01L 29/205 | (2006.01) | |
| H01L 29/66 | (2006.01) | |
| H01L 23/31 | (2006.01) | H01L 29/45 (2006.01) |
| H01L 29/20 | (2006.01) | |
| H01L 23/29 | (2006.01) | |

(52) U.S. Cl.
CPC ...... *H01L 21/0217* (2013.01); *H01L 21/0273* (2013.01); *H01L 21/02211* (2013.01); *H01L 21/02271* (2013.01); *H01L 21/31116* (2013.01); *H01L 21/31144* (2013.01); *H01L 23/3171* (2013.01); *H01L 29/205* (2013.01); *H01L 29/66462* (2013.01); *H01L 23/291* (2013.01); *H01L 29/2003* (2013.01); *H01L 29/452* (2013.01)

(58) Field of Classification Search
CPC .......... H01L 21/0217; H01L 21/02211; H01L 21/02271; H01L 21/0273; H01L 21/31116; H01L 21/31144; H01L 23/3171; H01L 29/2003; H01L 29/66462; H01L 23/291; H01L 29/452
See application file for complete search history.

(56) References Cited

U.S. PATENT DOCUMENTS

| | | | |
|---|---|---|---|
| 2002/0086541 A1* | 7/2002 | Fu | .............. C23C 16/345 438/700 |
| 2013/0083568 A1 | 4/2013 | Makiyama et al. | |
| 2013/0153923 A1 | 6/2013 | Decoutere | |

FOREIGN PATENT DOCUMENTS

| | | |
|---|---|---|
| JP | 2013-077621 | 4/2013 |
| JP | 2013-123047 | 6/2013 |

\* cited by examiner

*Primary Examiner* — Feifei Yeung Lopez
(74) *Attorney, Agent, or Firm* — Smith, Gambrell & Russell, LLP

(57) ABSTRACT

A process of forming a silicon nitride film on a nitride semiconductor layer as a passivation film is disclosed. The process first sets a temperature lower than 500° C. to load into a growth reactor, a wafer that provides the nitride semiconductor layer thereon. Then, the process raises the temperature to a deposition temperature higher than 750° C. while replacing the atmosphere in the reactor with pure ammonia ($NH_3$), or a mixed gas of $NH_3$ and $N_2$ with a $NH_3$ partial pressure greater than 0.2, and sets the pressure higher than 3 kPa. Finally, with the pressure lower than 100 Pa and di-chloro-silane ($SiH_2Cl_2$) supplied, the SiN is deposited on the nitride semiconductor layer.

9 Claims, 11 Drawing Sheets

PROCESS OF DEPOSITING SILICON NITRIDE (SIN) FILM ON NITRIDE SEMICONDUCTOR

CROSS REFERENCE TO RELATED APPLICATION

This application claims the benefit under 35 USC § 119(a) of Japanese Patent Application No. 2017-073821, filed on Apr. 3, 2017, the entire disclosure of which is incorporated herein by reference for all purposes.

BACKGROUND

1. Field of Invention

The present invention relates to a process of depositing silicon nitride (SiN) film on a nitride semiconductor material, in particular, the invention relates to a process of a low pressure chemical vapor deposition (LPCVD) for depositing a SiN film on a nitride semiconductor material.

2. Background Arts

Japanese Patent Applications laid open Nos. JP-2013-077621A and JP-2013-123047A have disclosed high electron mobility transistors (HEMTs) primarily made of nitride semiconductor materials. The HEMT disclosed in the former document includes semiconductor layers on a substrate made of silicon carbide (SiC) and a passivation film made of silicon nitride (SiN) that protects and passivates the semiconductor layers. The passivation layer disclosed therein, which is formed by plasma assisted chemical vapor deposition (PECVD) technique, provides an opening filled with a gate electrode.

Another HEMT disclosed in the latter document includes a stack including nitride semiconductor materials formed on the substrate. The stack is covered with a passivation film. The latter patent document has disclosed that the passivation film made of $Si_3N_4$ is preferably formed by a low pressure chemical vapor deposition (LPCVD) technique at a deposition temperature higher than 550° C., or further preferably higher than 700° C.

A semiconductor device formed by nitride semiconductor materials, typically gallium nitride (GaN), becomes popular in the field. Such a semiconductor device requires an insulating film to protect or passivate a surface thereof, where the insulating film may be made of an inorganic material containing silicon (Si), typically SiN, $SiO_2$, SiON, and so on. A nitride semiconductor material often provides an insulating layer made of SiN as a passivation film because of an existence of nitrogen (N), or both are common materials in a meaning of a nitride compound. In order not to raise a process temperature too high, such an SiN film is often formed by a plasma assisted process, such as a plasma assisted chemical vapor deposition (PECVD), or a sputtering using an electron cyclotron resonance. A plasma process, however, inevitably causes plasma damages in a surface of a nitride semiconductor material on which a SiN film is to be deposited.

While, another CVD process called as a low pressure CVD (LPCVD) is quite popular in a semiconductor process for silicon oriented devices. An LPCVD process is carried out at a relatively high temperature and under lower a deposition pressure for enhancing dissociation of source gases. Because of a high process temperature, a SiN film deposited by the LPCVD process usually shows good quality.

When the LPCVD technique is applied to a process for compound semiconductor materials such as GaN, the compound semiconductor materials are inevitably exposed in a high deposition temperature, which accelerates dissociation of group V elements, namely, nitrogen (N), arsenic (As), phosphorous (P), and so on from the surface of the materials. Accordingly, the compound semiconductor materials are degraded in the surfaces thereof after the LPCVD process. Besides, when di-chloro-silane ($SiH_2Cl_2$) is used as a source gas for silicon (Si) in the LPCVD process because $SiH_2Cl_2$ enhances homogeneity of a deposited SiN film, the surface of the nitride semiconductor material is inevitably degraded because chlorine (Cl) contained in $SiH_2Cl_2$ attacks and etches the nitride semiconductor material.

The present invention provides a technique to deposit a SiN film on a nitride semiconductor material by the LPCVD technique without substantially degrading a surface of the nitride semiconductor material.

SUMMARY

An aspect of the present invention relates to a process of depositing a silicon nitride (SiN) film on a nitride semiconductor material. The process includes steps of: (1) loading the nitride semiconductor material into a growth reactor; (2) purging the growth reactor with pure ammonia ($NH_3$) or a mixed gas of $NH_3$ and nitrogen ($N_2$) with a partial pressure of $NH_3$ greater than 0.2; (3) raising a temperature in the growth reactor from the first temperature to a second temperature higher than 750° C. as maintaining the growth reactor under a first pressure higher than 3 kPa; (4) decompressing a pressure in the growth reactor from the first pressure to a second pressure lower than 100 Pa under the second temperature; and (5) depositing the SiN film on the nitride semiconductor material by beginning a supply of di-chloro-silane ($SiH_2Cl_2$).

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present invention will be described as referring to drawings. The present invention, however, is not restricted to those embodiments, and has a scope defined in the claims attached hereto and all modifications equivalent thereto. Also, in the description of the drawings, numerals or symbols same with or similar to each other will refer to elements same with or similar to each other without duplicating explanations.

First Embodiment

Figure 1:
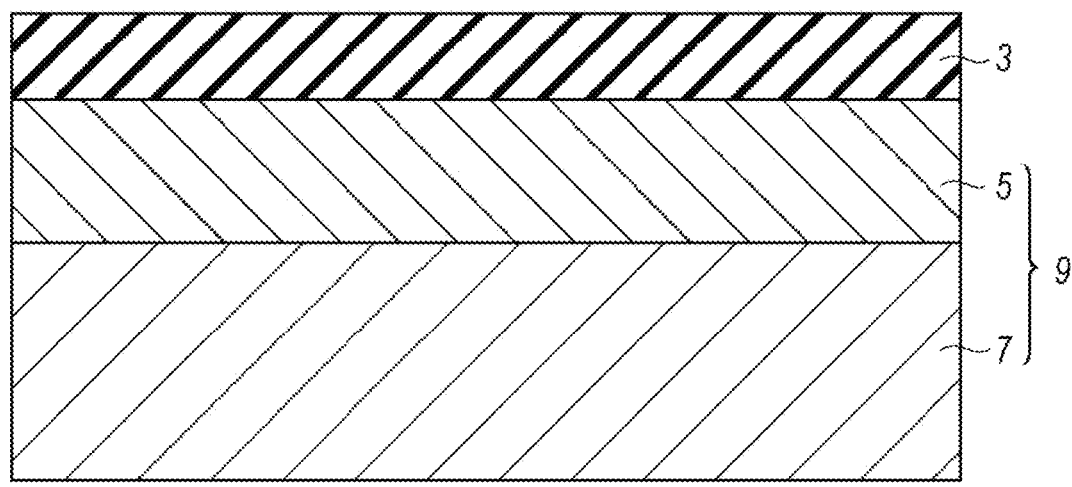
FIG. 1 shows a cross section of a passivation film deposited on a nitride semiconductor layer according to the first embodiment of the present invention.

FIG. 1 shows a cross section of a passivation film deposited on a nitride semiconductor layer according to the first embodiment of the present invention. The passivation film 3, which is in contact with a nitride semiconductor layer 5, may be deposited thereon by, what is called, a low pressure chemical vapor deposition (LPCVD) technique. The nitride semiconductor layer 5, which is grown on a substrate 7 made of silicon carbide (SiC), may be made of, for instance, gallium nitride (GaN). The substrate 7 and the nitride semiconductor layer 5 constitute an epitaxial wafer 9.

Figure 2:
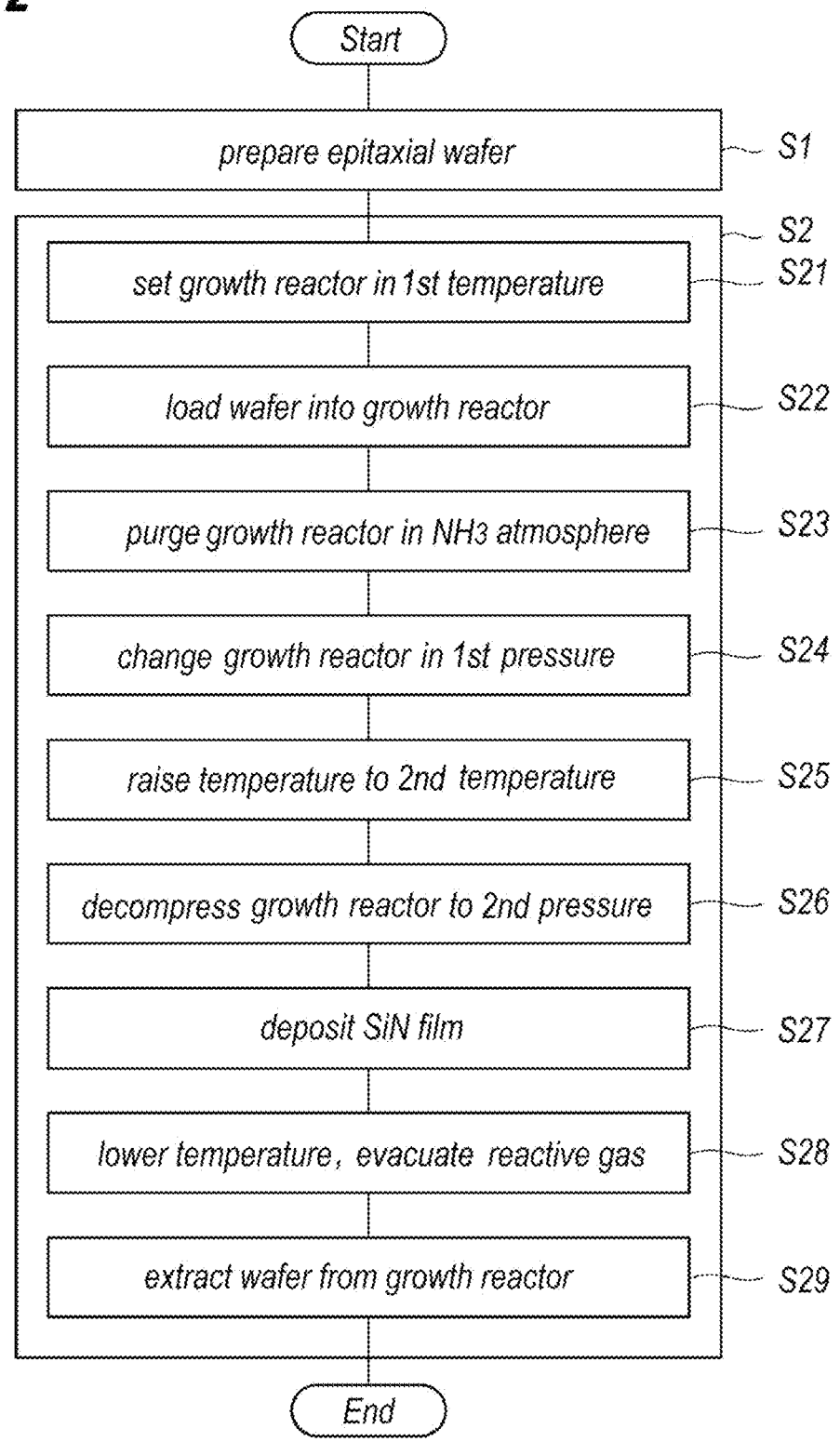
FIG. 2 shows a sequence of a process for depositing a passivation film made of silicon nitride (SiN)

FIG. 2 shows a sequence of a process for depositing a passivation film 3, which may be made of silicon nitride (SiN), according to the first embodiment of the present invention. First, the epitaxial wafer 9 is prepared by epitaxially growing the nitride semiconductor layer 5 on the substrate 7 at step S1. Then, the LPCVD technique may deposit the passivation film 3 made of silicon nitride (SiN) on the epitaxial wafer 9 at step S2.

Details of step S2 will be described. First, a temperature in a growth reactor of the LPCVD process is set to a first temperature that is lower than 500° C. in step S21. The first temperature may be lower than 400° C., or lower. The first embodiment sets the first temperature to be 500° C. Stabilizing a temperature in the growth reactor at the first temperature, the epitaxial wafer 9 is loaded within the growth reactor at an atmospheric air at step S22. Then, the process purges the growth reactor from air into ammonia ($NH_3$) by iterating vacuum drawing and ammonia filling, which is sometimes called as a cycle purge, at step S23. In an alternative, the step S23 may introduce a mixed gas of ammonia ($NH_3$) and nitrogen ($N_2$) with a partial pressure of $NH_3$ greater than 0.2.

Thereafter, the growth reactor in a pressure thereof is changed to a first pressure greater than 3 kPa in step S24. The first pressure may be greater than 10 kPa and lower than 100 kPa, which is an atmospheric pressure. The first embodiment sets the first pressure to be 3 kPa. Then, the growth reactor in a temperature thereof is raised to a second temperature that is higher than 750° C. as maintaining the pressure in the first pressure in step S25. The second temperature may be higher than 800° C. but lower than 900° C. The first embodiment sets the second temperature to be 800° C.

Thereafter, the pressure in the growth reactor is lowered to a second pressure in step S26 as keeping the growth reactor in ammonia ($NH_3$) atmosphere. The second pressure may be lower than 20 Pa but higher than 10 Pa. The first embodiment sets the second pressure to be 20 Pa. Then, supplying di-chloro-silane ($SiH_2Cl_2$) within the growth reactor, the SiN passivation film is deposited at step S27. In step S27, a flow rate of $SiH_2Cl_2$ and that of $NH_3$ may be substantially equal to each other. The present embodiment sets the flow rates of both sources to be 100 sccm, where 1 sccm means a standard cc per minute, that is, a flow rate of 1 $cm^3$/min at 1 atm and 0° C.

Completing the deposition of the SiN film, the sequence suspends the supplement of $SiH_2Cl_2$ and $NH_3$, lowers the temperature in the growth reactor to, for instance, 700° C. and purges the growth reactor with nitrogen ($N_2$) until a concentration of chlorine gas becomes lower than a detection limit at step S28. Finally, the epitaxial wafer 9 with a surface thereof covered with the SiN passivation film 3 is carried out from the growth reactor at step S29. Thus, the process to deposit the SiN passivation film 3 by the LPCVD technique is completed.

Figure 3:
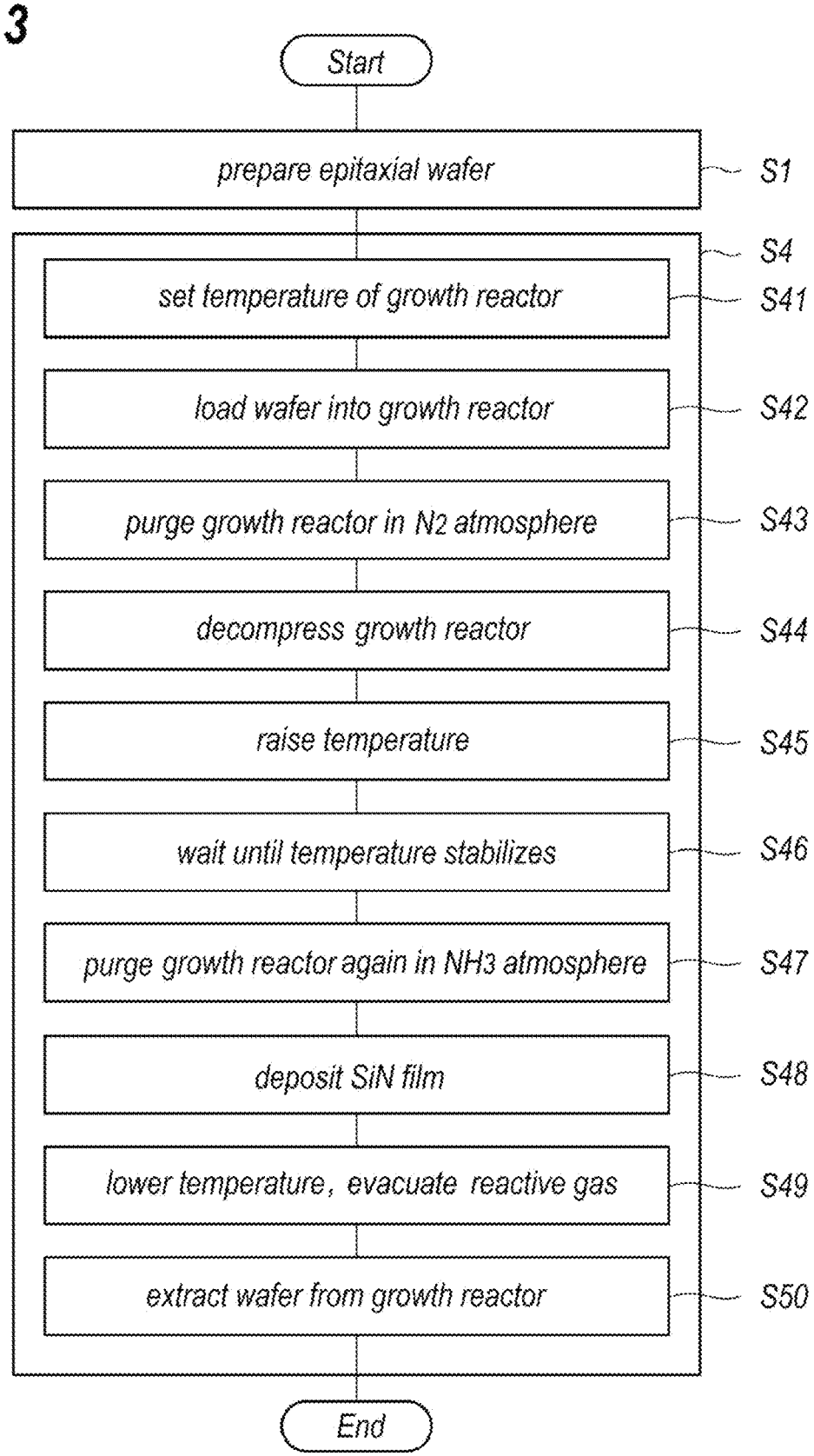
FIG. 3 shows a conventional sequence for depositing a passivation film made of SiN.

Advantages of the present invention for depositing the SiN passivation film 3 by the LPCVD technique will be described as comparing the invention with a conventional technique. FIG. 3 shows a conventional sequence for depositing a passivation film made of SiN by the LPCVD process. Similar to the embodiment described above, the conventional sequence deposits a SiN passivation film on the nitride semiconductor layer at step S4. Specifically, the conventional sequence first sets the temperature in the growth reactor to be 700° C. in step S41. After the growth reactor in a temperature thereof stabilizes at 700° C., the epitaxial wafer 9 is loaded into the growth reactor under an ambient air at step S42. Then, the growth reactor is replaced to $N_2$ atmosphere by iterating vacuum drawing and $N_2$ filling at step S43.

Then, at step S44, the sequence lowers the pressure in the growth reactor to be, for instance, 20 Pa which is substantially equal to a depositing pressure of the SiN passivation film. Thereafter, the temperature in the growth reactor is raised to a growth temperature, which may be, for instance, 800° C. in step S45. After stabilizing the temperature in the growth reactor, the growth reactor is replaced to an $NH_3$ atmosphere from an $N_2$ atmosphere by iterating vacuum drawing and $NH_3$ filling at step S47. After the replacement of the atmosphere, the growth reactor in the pressure thereof is changed to be 20 Pa, which is the growth pressure, at a flow rate of $NH_3$ to be 100 sccm, and then supplying di-chloro-silane ($SiH_2Cl_2$) within the growth reactor, the deposition of the SiN film 3 is carried out at step S48. The flow rate of $SiH_2Cl_2$ is set to be 100 sccm.

Figure 4:
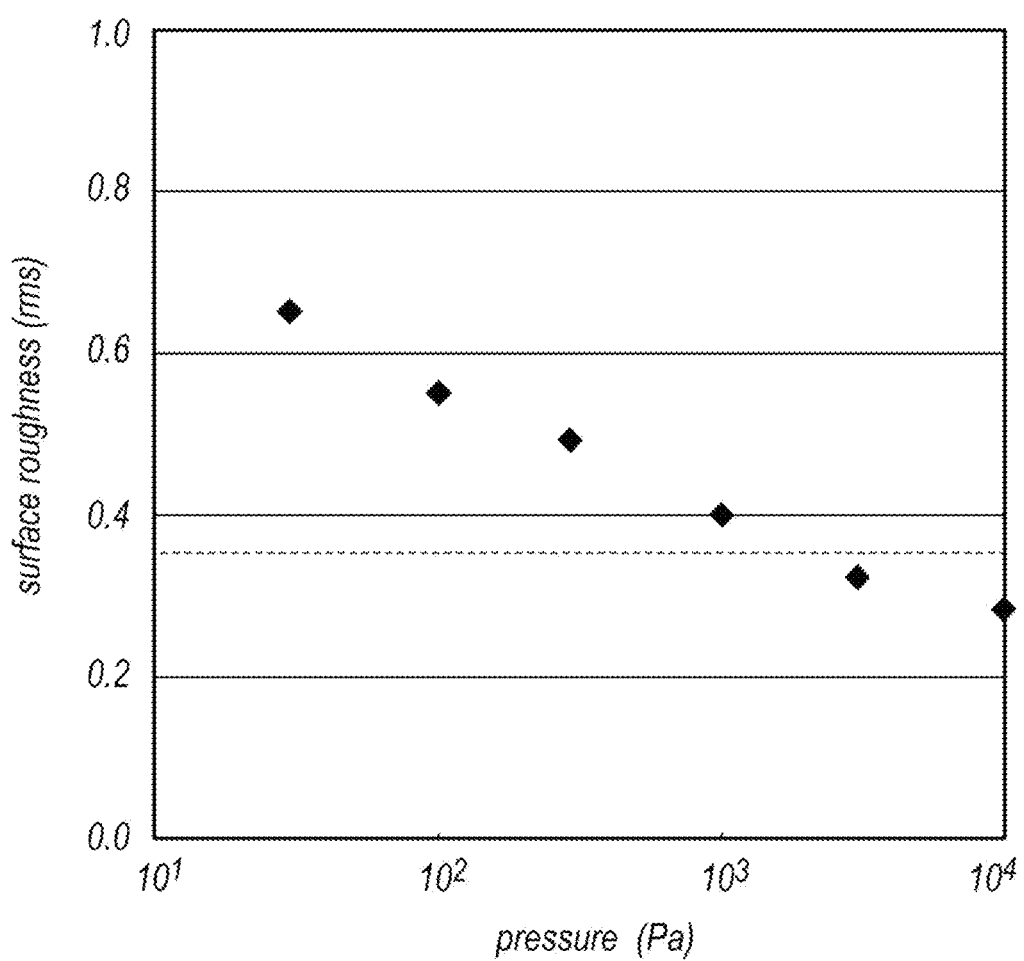
FIG. 4 shows a behavior of surface roughness of the nitride semiconductor layer against a growth pressure in a reactor.

Step S24 shown in FIG. 2 sets the growth reactor in a high pressure higher than 3 kPa in advance to raise a temperature of the growth reactor. FIG. 4 shows a behavior of surface roughness of the nitride semiconductor layer 5 against a growth pressure before the practical deposition thereof, where the surface roughness is denoted by a root mean square (RMS) factor and measured by an atomic force microscope (AFM) for the surface of the nitride semiconductor layer 5 after removing the SiN passivation film 3 by hydrofluoric acid (HF). The surface roughness appearing in subsequent figures are obtained by the manner same with that described above. The behavior of the roughness shown in FIG. 4 is obtained by a condition that a loading temperature at which the epitaxial wafer is loaded into the growth reactor is 400° C.

Referring to FIG. 4, as the pressure in advance to the deposition, which may be called as a pre-pressure, becomes higher; the surface roughness of the semiconductor layer 5 becomes smaller. The pre-pressure higher than 100 Pa, the surface roughness becomes 0.49 nm or smaller. The pre-pressure greater than 3 kPa lowers the surface roughness to a value smaller than 0.28 nm.

Figure 5:
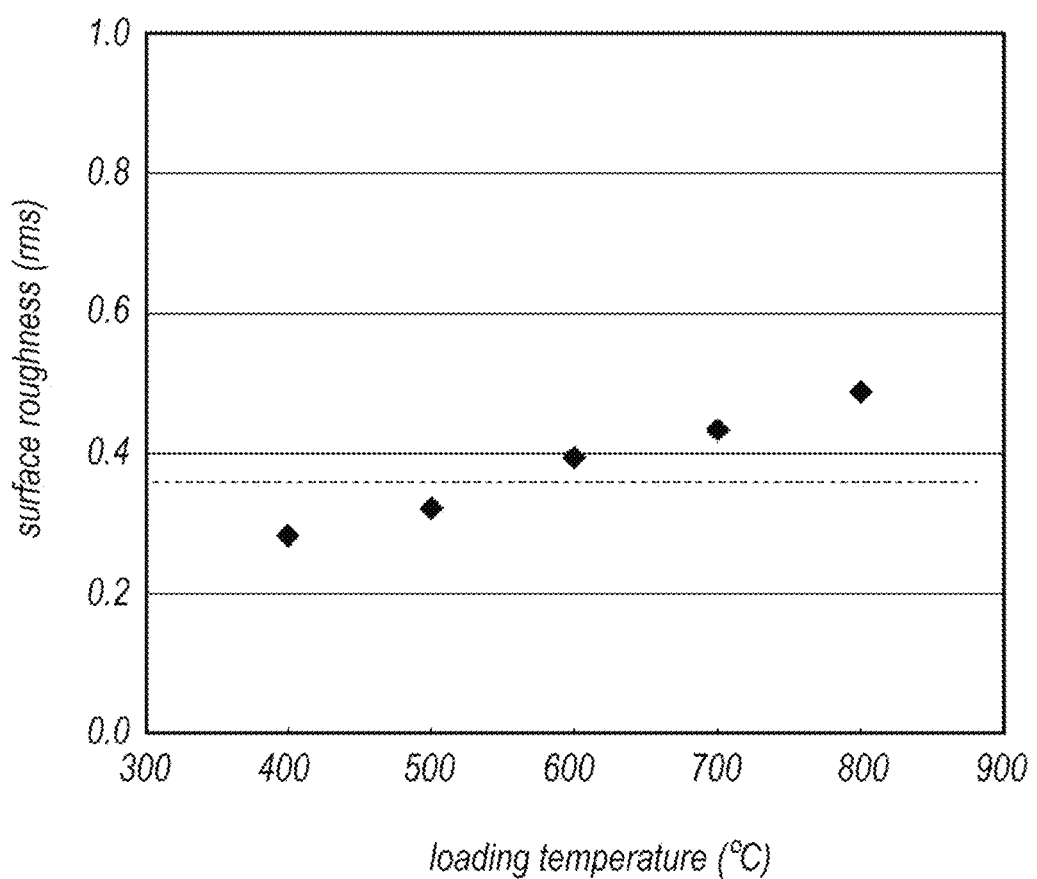
FIG. 5 shows a behavior of the surface roughness of the nitride semiconductor layer against a temperature at which a nitride semiconductor is loaded into the reactor.

Also, step S21 shown in FIG. 2 of the present invention sets the growth reactor in the first temperature lower than 500° C., while, the conventional sequence shown in FIG. 3 sets the growth reactor in the temperature thereof to be 700° C. FIG. 5 shows a behavior of the surface roughness of the nitride semiconductor layer 5 against a temperature at which the epitaxial wafer is loaded into the reactor. The behavior shown in FIG. 5 was taken at the conditions of the pre-pressure of 10 kPa and the $NH_3$ atmosphere just before the deposition of the SiN passivation film 3.

Referring to FIG. 5, the temperature just before the deposition, which may be called as a pre-temperature, becomes lower; the surface roughness becomes lower. For instance, the pre-temperature lower than 500° C. realizes the surface roughness of substantially 0.28 nm.

Figure 6:
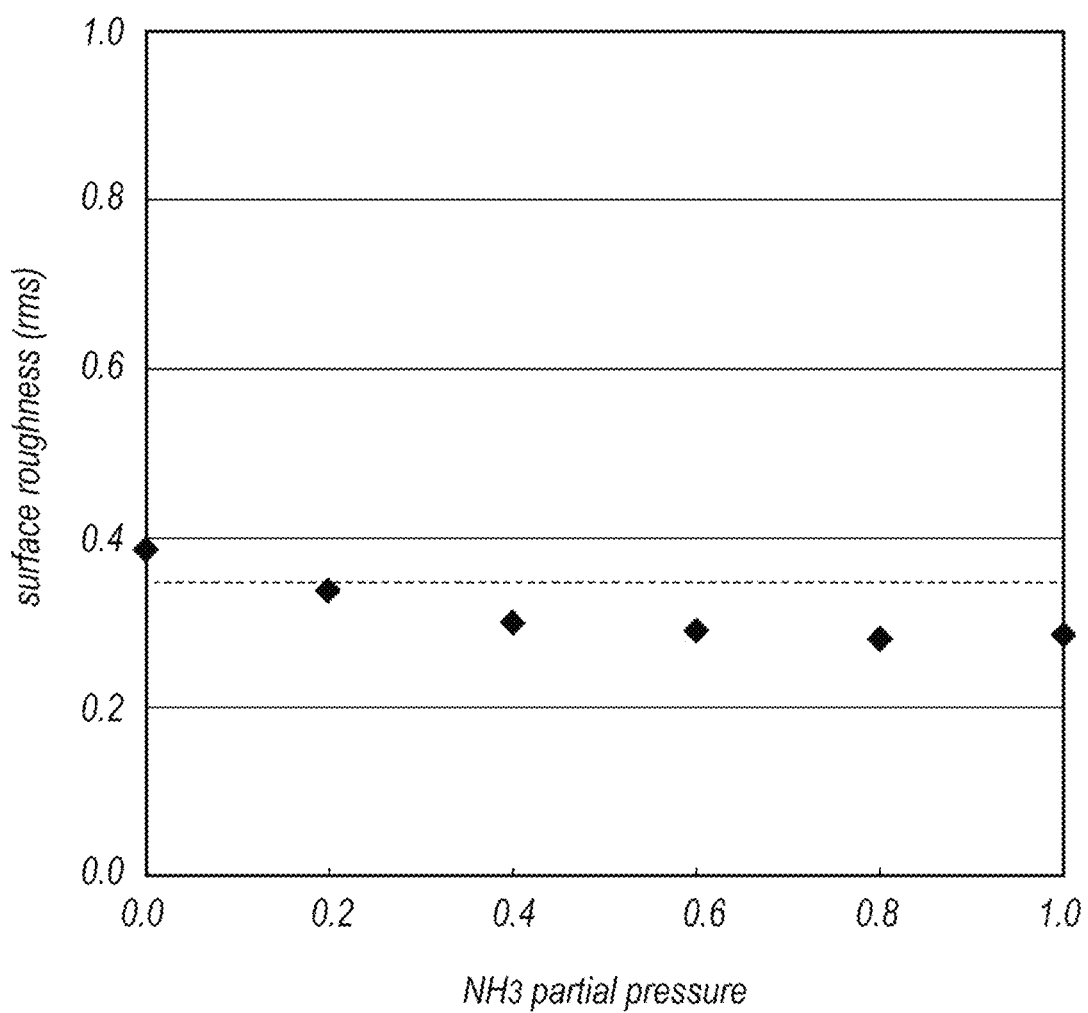
FIG. 6 shows a behavior of the surface roughness of the nitride semiconductor layer against a partial pressure of ammonia ($NH_3$)

Step S23 of the present embodiment changes the growth reactor from an air atmosphere to an $NH_3$ atmosphere or an atmosphere by a mixed gas of ammonia ($NH_3$) and nitrogen ($N_2$) with an $NH_3$ partial pressure greater than 0.2. FIG. 6 shows a behavior of the surface roughness of the nitride semiconductor layer 5 against the $NH_3$ partial pressure, where the partial pressure smaller than 1.0 means that the growth reactor is set in the mixed atmosphere of $NH_3$ and $N_2$. The behavior shown in FIG. 6 was obtained in the conditions that, the loading temperature of the epitaxial wafer is set to 400° C. and the first pressure under which the temperature in the growth reactor is raised to the growth temperature was set to be 10 kPa.

Referring to FIG. 6, the surface roughness of the nitride semiconductor layer 5 becomes smaller as the $NH_3$ partial pressure increases. The $NH_3$ partial pressure of 0.2, 0.4, 0.6 and 0.8 resulted in the surface roughness of 0.34, 0.30, 0.29, and 0.28 nm in the RMS factor, respectively. When step S25, at which the temperature in the growth reactor is raised to the growth temperature, is carried out under the $NH_3$ partial pressure greater than 0.6, which is set in step S24, the step S47 conventionally necessary for the iterated purging in the growth reactor to $NH_3$ atmosphere becomes unnecessary. The surface of the nitride semiconductor layer 5 becomes unnecessary to be exposed to an ambience of a vacuum at a high temperature; the surface may be protected from the dissociation of nitrogen (N). Accordingly, a condition of the $NH_3$ partial pressure higher than 0.6 is preferable for depositing the SiN passivation film 3 by the LPCVD technique.

Figure 7A:
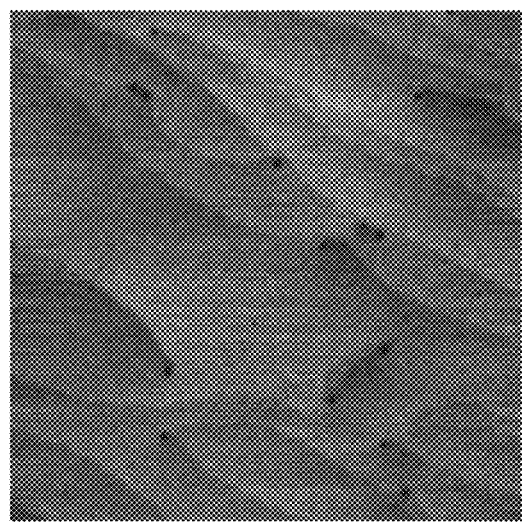
FIG. 7A to FIG. 7C show photographs of a surface of the nitride semiconductor layer taken by an atomic force microscope.
Figure 7B:
Figure 7C:
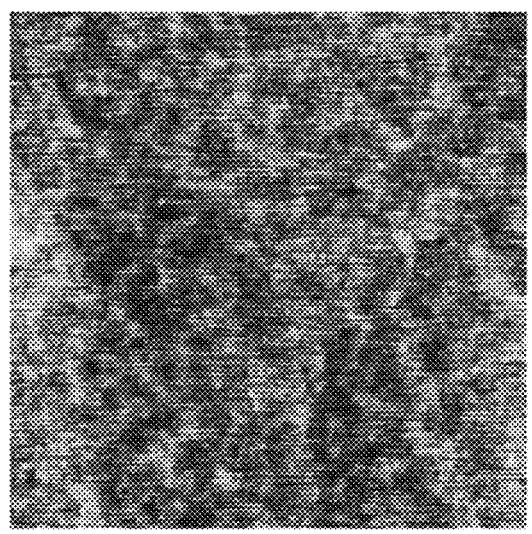

The surface statuses of the nitride semiconductor layer 5 within a range of 1 μm×1 μm taken by an atomic force microscope are shown in FIG. 7A to FIG. 7C, where FIG. 7A corresponds to the surface roughness smaller than 0.35 nm, which means that the surface is almost free from degradation. FIG. 7B corresponds to the surface roughness of 0.35 to 0.50 where the surface is slightly degraded, and FIG. 7C corresponds to the surface roughness higher than 0.5, which means the surface is thoroughly degraded. The photographs in FIG. 7A to FIG. 7C are took for the surfaces of the nitride semiconductor layer 5 before the deposition of the SiN passivation film 3 but the steps before step S27 for depositing the SiN film 3 is carried out. FIG. 7A clearly shows steps of atomic layers and about a dozen of dislocations. When the surface roughness exceeds 0.35, which is shown by the photograph of FIG. 7B; many pits appear in the surface, which are traces of the dissociation of nitrogen (N) atoms. The surface roughness higher than 0.5, which is shown by the photograph of FIG. 7C, the surface of the nitride semiconductor layer 7 becomes fully degraded such that the steps by the atomic layers are unable to be observed, where the degradation derives from dark spots appearing in FIG. 7B which have a width of 5 to 20 nm and a depth of 0.5 to 2 nm. The dark spots appearing in the photograph shown in FIG. 7C increases and becomes larger so as to be overlapped each other.

When the pre-pressure before the deposition becomes higher than 3 kPa, the RMS factor of the surface roughness lowers to 0.32 nm. Accordingly, setting the pre-pressure in the growth reactor to be higher than 3 kPa at step S24 in FIG. 2; a non-degraded surface of the semiconductor layer 5 like that shown in FIG. 7A may be obtained.

Also, when the first temperature, namely, the loading temperature for the epitaxial wafer 9 in to the growth reactor, becomes lower than 500° C., the RMS factor of the surface roughness of the nitride semiconductor layer 5 becomes 0.32. Accordingly, setting the first temperature at step S21 to be lower than 500° C., a non-degraded surface of the nitride semiconductor layer 5 may be obtained.

Also, because the $NH_3$ atmosphere or the $NH_3$ partial pressure higher than 0.2 in the mixed atmosphere of $NH_3$ and $N_2$ lowers the RMS factor to 0.34 nm; a non-degraded surface of the nitride semiconductor layer 5 like that shown in FIG. 7A may be obtained by setting the $NH_3$ pressure against nitrogen (N) higher than 0.2 at step S23 in FIG. 2.

Second Embodiment

Figure 8A:
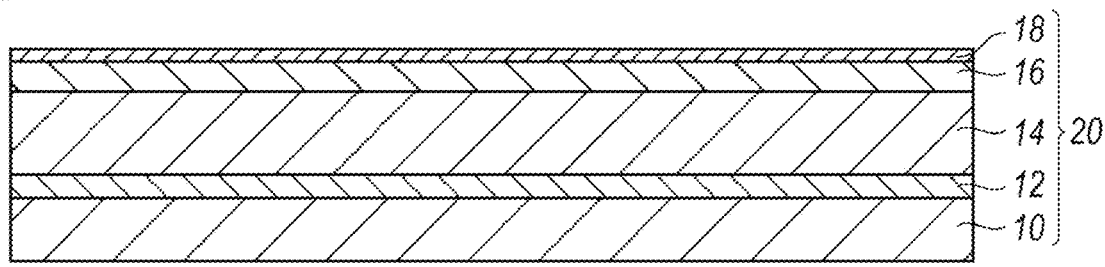
FIG. 8A to FIG. 8C show cross sections of a semiconductor device at respective steps of a process according to the second embodiment of the present invention.
Figure 8B:
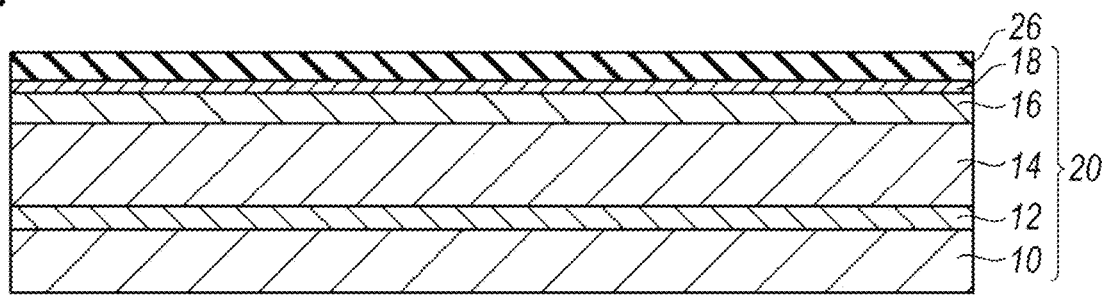
Figure 8C:
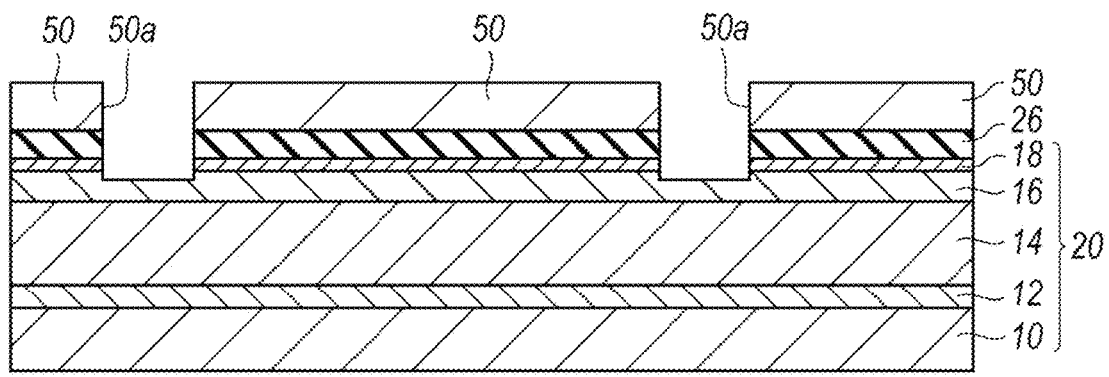

Another process of forming a semiconductor device that provides the SiN passivation film deposited on the nitride semiconductor layer 5 by the sequence of the first embodiment will be described as the second embodiment of the present invention. Cross sections of the semiconductor device at respective steps of a process are shown in FIG. 8A to FIG. 8C. The semiconductor device of the present embodiment has a type of, what is called as, gallium nitride (GaN) high electron mobility transistor (HEMT).

First, as shown in FIG. 8A, the process sequentially grows nitride semiconductor layers on the substrate 10 by the MOCVD technique. The substrate 10 may be made of silicon carbide (SiC) with a primary surface of a (0001) crystal plane, where a stacking direction corresponds to a [0001] crystal orientation. The semiconductor stack 20 includes, from the side of the substrate 10, a nucleus forming layer 12, an electron transit layer 14, an electron supply layer 16, and a cap layer 18. The nucleus forming layer 12, which may be made of aluminum nitride (AlN) has a thickness of scores of nanometer. The electron transit layer 14, which may be made of un-doped GaN, has a thickness of about 1000 nm, exactly, preferably thicker than 500 nm. The electron supply layer 16, which may be made of aluminum gallium nitride (AlGaN), has a thickness of 20 nm, and the cap layer 18, which may be made of gallium nitride (GaN), has thickness of 5 nm.

Then, as shown in FIG. 8B, the SiN passivation film 26 is deposited on the semiconductor stack 20 by the process of the first embodiment, where the SiN passivation film 26 has a thickness of 100 nm but not restricted thereto. The SiN passivation film 26 in the thickness thereof may depend on other layer configurations of the HEMT 1A. The deposition may be carried out at a temperature of 800° C. and using sources of $NH_3$ and di-chloro-silane ($SiH_2Cl_2$) for nitride (N) and silicon (Si), respectively.

Thereafter, as shown in FIG. 8C, a photoresist 50 coats the SiN film 26, where the photoresist 50 has an opening 50a. Then, the SiN film 26 and the cap layer 18 in respective portions corresponding to the opening 50a are sequentially dry-etched by the reactive ion etching (RIE) to expose the electron supply layer 16. The dry-etching slightly etches the electron supply layer 16 to form recesses therein. After the etching, the photoresist 50 is fully removed.

Figure 9A:
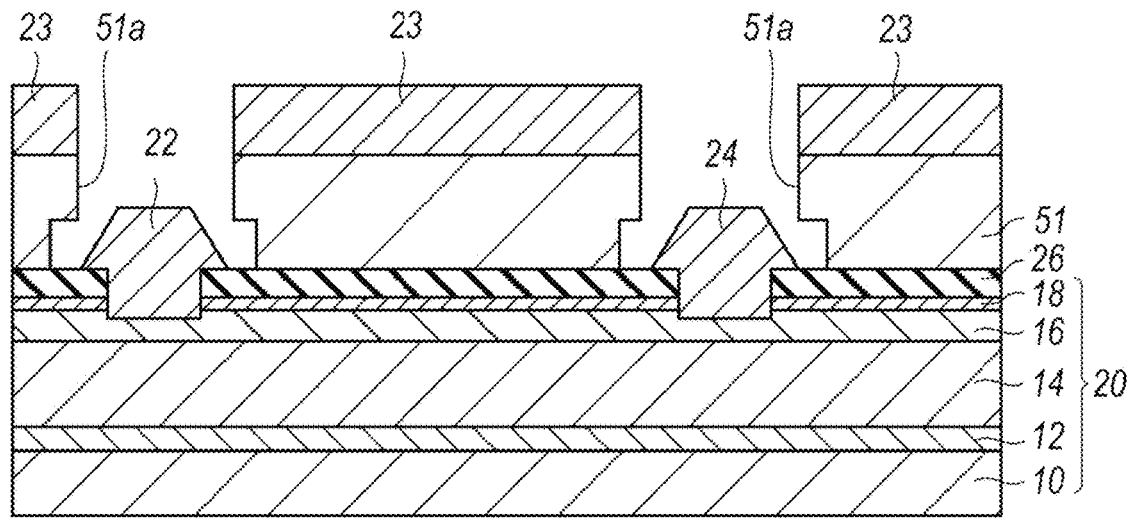
FIG. 9A and FIG. 9B show cross sections of the semiconductor device at respective steps subsequent to the step shown in FIG. 8C.

Thereafter, as shown in FIG. 9A, another photoresist 51 coats the SiN film 26, where the other photoresist 51 also provides an opening 51a with a size expanded from that of the former opening 50a. The electron supply layer 16 exposed in the former step is fully exposed in the opening 51a. Then, metals for the source electrode 22 and the drain electrode 24 are evaporated on the electron supply layer 16, where the metals include titanium (Ti) with a thickness of 30 nm and aluminum (Al) with a thickness of 300 nm. In an alternative, titanium (Ti) may be replaced to tantalum (Ta) with a thickness of about 30 nm. Metals 23 are also deposited on the photoresist 51 as residual parts, but the residual parts of the metals 23 may be removed concurrently with the photoresist 51. Then, heat-treating at a temperature around 400° C. or higher, the metals, 22 and 24, may be alloyed on the electron supply layer 16 to form the source electrode 22 and the drain electrode 24. The heat treatment at a temperature higher than 550° C., the source electrode 22 and the drain electrode 24 may further reduce contact resistance thereof against the electron supply layer 16.

Figure 9B:
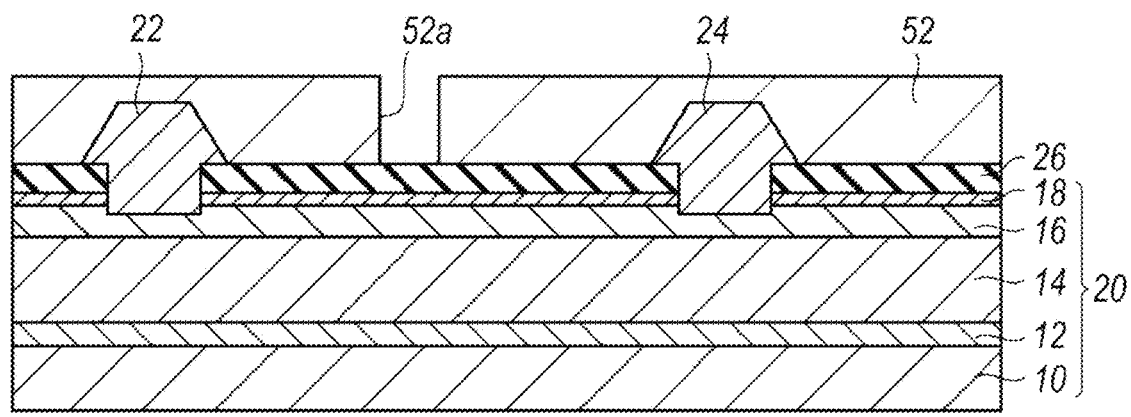

Thereafter, as shown in FIG. 9B, still another photoresist 52 coats the SiN film 26 so as to cover the source and drain electrodes, 22 and 24, where the photoresist 52 also provides an opening 52a. Then, the dry-etching may selectively etch the SiN film 26 exposed in the opening 52a to form a window in the SiN film 26. After the dry-etching, the photoresist 52 is fully removed.

Figure 10A:
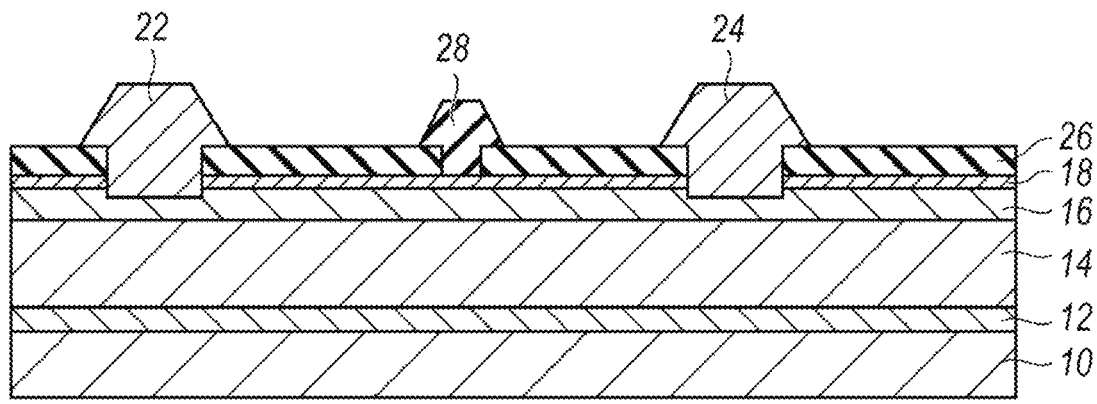
FIG. 10A and FIG. 10B show cross sections of the semiconductor device at respective steps subsequent to the step shown in FIG. 9B.

Thereafter, similar to the step shown in FIG. 9A, still another photoresist coats the SiN film 26 so as to expose the window in the SiN film 26 formed in the previous step. Then, the vacuum evaporation deposits the gate electrode 28 within the window of the SiN film 26 as shown in FIG. 10A. The gate electrode 28 includes stacked metals of nickel (Ni) with a thickness of 50 nm and gold (Au) with a thickness of 400 nm, where Ni is in contact with the cap layer 18. Residual metals accumulated on the photoresist may be removed together with the removal of the photoresist.

Figure 10B:
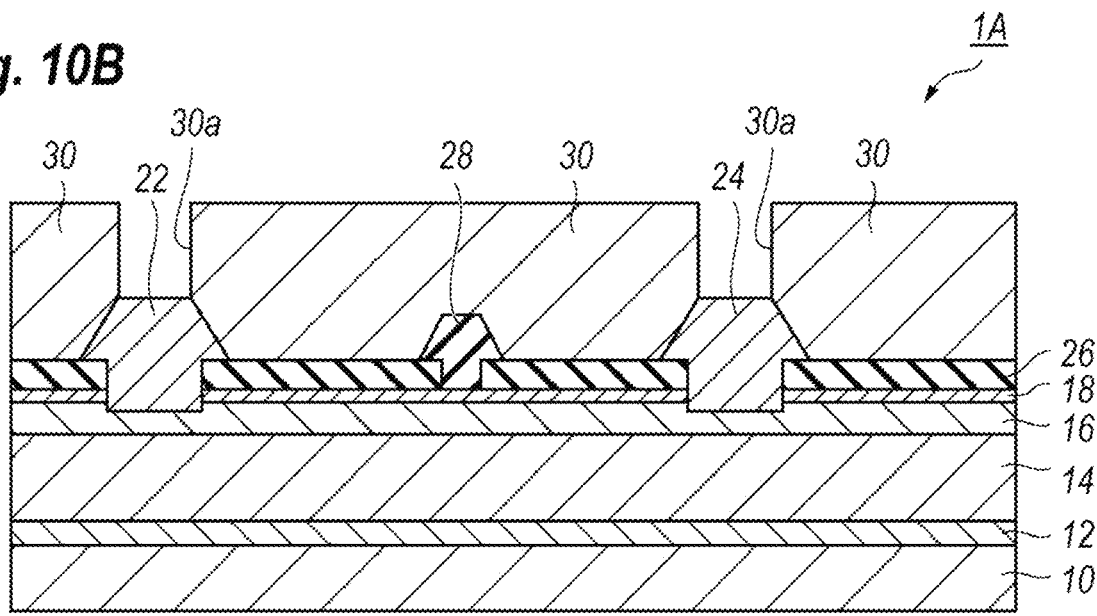

Thereafter, as shown in FIG. 10B, an insulating film 30 may coat the SiN film 26 by, for instance, plasma assisted chemical vapor deposition (PECVD) technique so as to fully cover the electrodes, 22 to 28. The insulating film 30 may be made of silicon nitride (SiN) with a thickness of 500 nm. Forming an opening 30a in the insulating film 30 at a position corresponding to the source and drain electrodes, 22 and 24, by an wet-etching using buffered hydrofluoric acid (BHF), the source and drain electrodes, 22 and 24, in respective tops thereof expose within the openings 30a. Thus, the process of forming a HEMT 1A is completed.

Figure 11:
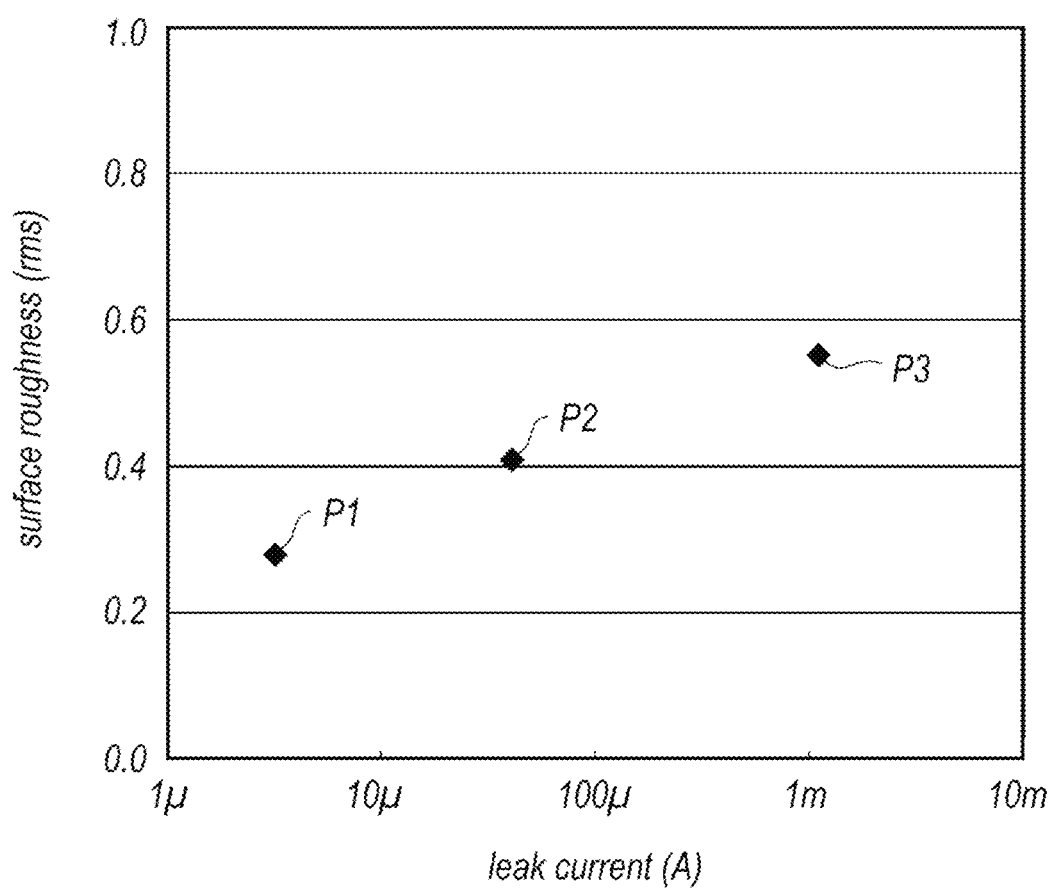
FIG. 11 shows a behavior of the surface roughness against a leak current of the semiconductor device.

The HEMT thus formed by the process described above may enhance performances thereof due to the existence of the SiN passivation film 26 formed on the nitride semiconductor layer formed by the LPCVD technique. FIG. 11 shows a behavior of the surface roughness of the nitride semiconductor layer against a gate leak current of the HEMT 1A, where the roughness, denoted in the unit of RMS, corresponds to that appearing in the surface of the semiconductor stack 20, namely, in a top surface of the cap layer 18, and the gate leak current was measured between the gate and drain electrodes as applying a bias of 50 V between the gate electrode and the drain electrode but opening the source electrode. Points $P_1$ to $P_3$ corresponding to the conditions for depositing the SiN passivation film listed in a table below, where the HEMT has dimensions of a source-drain distance Lsd of 7.2 μm, a source-gate distance Lsg of 1.4 μm, a gate-drain distance Lgd of 5.2 μm, a gate length Lg of 0.6 μm, and a gate width of 500 μm.

|  | $P_1$ | $P_2$ | $P_3$ |
| --- | --- | --- | --- |
| loading temperature | 400° C. | 600° C. | 600° C. |
| pressure during temperature rise | 10000 Pa | 300 Pa | 30 Pa |
| atmosphere during temperature rise | $NH_3$ | $N_2$ | $N_2$ |

The leak current decreases as the roughness of the semiconductor stack 20 decreases, as shown in FIG. 11. The point P1, which corresponds to conditions of the loading temperature of the epitaxial wafer that exposes the semiconductor stack 20 thereof at 400° C., the pre-pressure of 10 kPa before the practical deposition, and the atmosphere during the temperature rise of ammonia ($NH_3$), shows the minimum leak current. A difference between the points P2 and P3, seems to be due to the pressure during the temperature rise, where the former is done at 300 Pa while, the latte is done at 30 Pa.

While there has been illustrated and described what are presently considered to be exemplary embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed above, but that the invention includes all embodiments falling within the scope of the appended claims.

What is claimed is:

1. A process of depositing a silicon nitride (SiN) film on a nitride semiconductor material, the process comprising steps of:
   loading the nitride semiconductor material into a growth reactor at a first temperature lower than 500° C.;
   purging the growth reactor with pure ammonia ($NH_3$) or a mixed gas of ammonia ($NH_3$) and nitrogen ($N_2$) with a partial pressure of $NH_3$ greater than 0.2;
   raising a temperature in the growth reactor from the first temperature to a second temperature that is higher than 750° C. while maintaining the growth reactor at a first pressure higher than 3 kPa;
   lowering a pressure in the growth reactor from the first pressure to a second pressure lower than 100 Pa at the second temperature; and
   depositing the SiN film on the nitride semiconductor material by beginning a supply of di-chloro-silane ($SiH_2Cl_2$).

2. The process according to claim 1,
   wherein the step of purging the growth reactor includes a step of purging the growth reactor with a mixed gas of $NH_3$ and $N_2$ with the $NH_3$ partial pressure higher than 0.6 and lower than 1.0.

3. The process according to claim 1,
wherein the second temperature is lower than 900° C.

4. The process according to claim 1,
wherein the first pressure is higher than 10 kPa.

5. A process of forming a nitride semiconductor device, comprising steps of:
   sequentially growing semiconductor layers on a substrate by a metal organic chemical vapor deposition (MOCVD) technique, the semiconductor layers including a nitride semiconductor layer in a top thereof;
   forming a passivation film made of silicon nitride (SiN) on the nitride semiconductor layer by steps of,
      loading the substrate into a growth reactor at a first temperature lower than 500° C.,
      purging the growth reactor in an atmosphere with pure ammonia ($NH_3$) or a mixed gas of ammonia ($NH_3$) and nitrogen ($N_2$) with a partial pressure of $NH_3$ greater than 0.2,
      raising a temperature in the growth reactor from the first temperature to a second temperature that is higher than 750° C. while maintaining a pressure in the growth reactor at a first pressure higher than 3 kPa,
      lowering the growth reactor to a second pressure lower than 100 Pa at the second temperature, and
      depositing the passivation film on the nitride semiconductor layer by supplying di-chloro-silane ($SiH_2Cl_2$); and
   forming an electrode on the nitride semiconductor layer by forming an opening in the passivation film and depositing a metal within the opening of the passivation film so as to be in contact with the nitride semiconductor layer.

6. The process according to claim 5,
wherein the step of purging the growth reactor purges the growth reactor with a mixed gas of $NH_3$ and $N_2$ with the $NH_3$ partial pressure higher than 0.6 and lower than 1.0.

7. The process according to claim 5,
wherein the second temperature is lower than 900° C.

8. The process according to claim 5,
wherein the first pressure is higher than 10 kPa.

9. The process according to claim 5,
wherein the step of depositing the passivation film deposits the SiN to have a thickness of 100 nm.

* * * * *